United States Patent
Jones

(10) Patent No.: US 8,526,236 B2
(45) Date of Patent: Sep. 3, 2013

(54) PROGRAMMING METHODS FOR A MEMORY DEVICE

(75) Inventor: Mason Jones, Seaford, VA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/614,223

(22) Filed: Sep. 13, 2012

(65) Prior Publication Data

US 2013/0010540 A1    Jan. 10, 2013

Related U.S. Application Data

(62) Division of application No. 12/763,257, filed on Apr. 20, 2010, now Pat. No. 8,295,095.

(51) Int. Cl.
    *G11C 16/10*      (2006.01)

(52) U.S. Cl.
    USPC ............ 365/185.19; 365/185.03; 365/185.22; 365/185.17; 365/185.18; 365/185.28

(58) Field of Classification Search
    USPC ............. 365/185.19, 185.03, 185.22, 185.17, 365/185.18, 185.28
    See application file for complete search history.

(56) References Cited

U.S. PATENT DOCUMENTS

| | | | |
|---|---|---|---|
| 7,570,520 B2 * | 8/2009 | Kamei et al. | 365/185.19 |
| 8,369,141 B2 * | 2/2013 | Sommer et al. | 365/185.03 |
| 2005/0232017 A1 | 10/2005 | Fujisawa et al. | |
| 2008/0056006 A1 | 3/2008 | Jung et al. | |
| 2008/0183951 A1 | 7/2008 | Lee et al. | |
| 2009/0141558 A1 | 6/2009 | Sarin et al. | |
| 2009/0231926 A1 | 9/2009 | Sarin et al. | |
| 2009/0323412 A1 * | 12/2009 | Mokhlesi et al. | 365/185.02 |
| 2010/0142268 A1 * | 6/2010 | Aritome | 365/185.02 |
| 2011/0222353 A1 | 9/2011 | Pabustan et al. | |

* cited by examiner

*Primary Examiner* — Toan Le
*Assistant Examiner* — Hai Pham
(74) *Attorney, Agent, or Firm* — Leffert Jay & Polglaze, P.A.

(57) ABSTRACT

Methods for programming, memory devices, and memory systems are disclosed. In one such method for programming, a target memory cell is partially programmed to a final target programmed state where the partial programming is verified by applying a ramped voltage having a first voltage range (e.g., where the first voltage range is selected in response to program coupling effects from memory cells adjacent to the target memory cell.) A programming operation following the partial programming operation is performed on one or more adjacent memory cells which is then followed by additional programming of the target memory cell to adjust the memory cell from the partially programmed state to the final programmed state. A ramped voltage having a second voltage range different from the first voltage range is utilized to verify the programming of the target memory cell to the final programmed state.

20 Claims, 12 Drawing Sheets

PROGRAMMING METHODS FOR A MEMORY DEVICE

RELATED APPLICATION

This Application is a Divisional of U.S. application Ser. No. 12/763,257, titled "PROGRAMMING METHODS FOR A MEMORY DEVICE," filed Apr. 20, 2010, now U.S. Pat. No. 8,295,095 which is commonly assigned and incorporated herein by reference.

TECHNICAL FIELD

The present disclosure relates generally to semiconductor memories and, in particular, in one or more embodiments, the present disclosure relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the memory cells 102 of the memory array are logically arranged in an array of rows and columns. In a conventional NAND Flash architecture, "rows" refers to memory cells having commonly coupled control gates 120, while "columns" refers to memory cells coupled as a particular NAND string 108, for example. The memory cells 102 of the array are arranged together in strings (e.g., NAND strings), typically of 8, 16, 32, or more each. Each memory cell of a string are connected together in series, source to drain, between a source line 114 and a data line 116, often referred to as a bit line. The array is accessed by a row decoder (not shown) activating a logical row of memory cells by selecting a particular access line, often referred to as a word line, such as WL7-WL0 $118_7$-$118_0$, for example. Each word line is coupled to the control gates of a row of memory cells. Bit lines BL1-BL4 $116_{1-4}$ can be driven high or low depending on the type of operation being performed on the array. These bit lines BL1-BL4 $116_{1-4}$ are coupled to sense devices (e.g., sense amplifiers) 130 that detect the state of a target memory cell by sensing voltage or current on a particular bit line 116, for example. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. MLC memory cells may store even or odd numbers of bits on each memory cell. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

FIG. 2 illustrates an example of Vt ranges 200 for a MLC (four level) (e.g., 2-bit) memory cell. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and may have a range of 200 mV to 400 mV) is maintained between each range 202-208 to keep the ranges from overlapping. As an example, if the voltage stored on a memory cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells. This typically results in the Vt of memory cells residing in the Vt range 202 (e.g., erased state) of FIG. 2, for example.

Programming typically involves applying one or more programming pulses to a selected word line (e.g., WL4 $118_4$) and thus to the control gate of each memory cell $120_1$-$120_4$ coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the storage structures of memory cells targeted for programming. More specifically, the storage structures are typically charged through direct injection or Fowler-Nordheim tunneling of electrons from the channel to the storage structure, resulting in a Vt typically greater than zero in a programmed state, such as in Vt ranges 204-208 of FIG. 2, for example. In addition, an inhibit voltage is typically applied to bit lines not coupled to a NAND string containing a memory cell that is targeted (e.g., selected) for programming. Typically a verify operation is performed following each applied programming pulse to determine if the selected memory cells have achieved their target (e.g., intended) programmed state. A verify operation generally includes performing a sense operation to determine if a threshold voltage of a memory cell has reached a particular target value.

Typically, alternating bit lines are enabled $116_1, 116_3$ and/or inhibited $116_2, 116_4$ during a programming (e.g., write) and/or a read operation performed on a selected row of memory cells 120. This is illustrated by the solid and dashed circles shown around memory cells 120, for example. During a typical programming operation, an effect which is known as program disturb can occur where some memory cells coupled to the selected word line may reach their target threshold voltage before other memory cells coupled to the same word line reach their target threshold voltages. This condition is especially likely to occur in MLC memory. For example, one or more memory cells of a particular row might have a target threshold voltage within range 204 and others may have a target threshold voltage within range 208, for example. Thus it is possible that memory cells having a target threshold voltage within range 208 will require additional programming pulses after the memory cells having a target threshold voltage within range 204 have completed programming, for example.

The continued application of programming pulses to a selected word line (such as to complete programming of one or more memory cells of a row) can cause these program disturb issues. This is because memory cells which have achieved their target programmed states and are inhibited from programming can still experience a shift in their threshold voltage due to the continued application of programming pulses to the selected word line, for example.

For the reasons stated above, and for other reasons stated below which will become apparent to those skilled in the art upon reading and understanding the present disclosure, there is a need in the art for alternate programming methods for memory devices.

DETAILED DESCRIPTION

Figure 1:
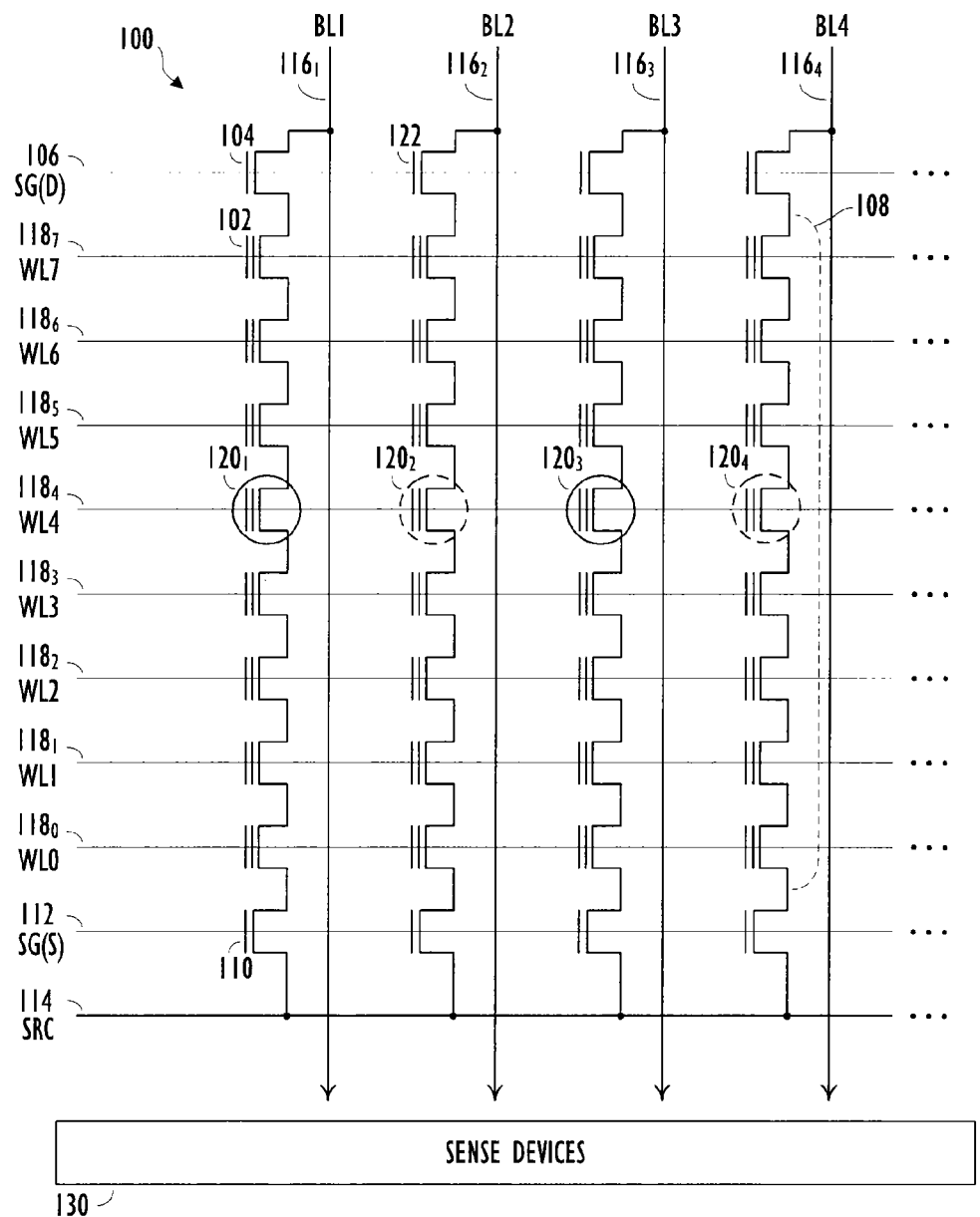
FIG. 1 shows a schematic representation of an array of NAND configured memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense.

Figure 2:
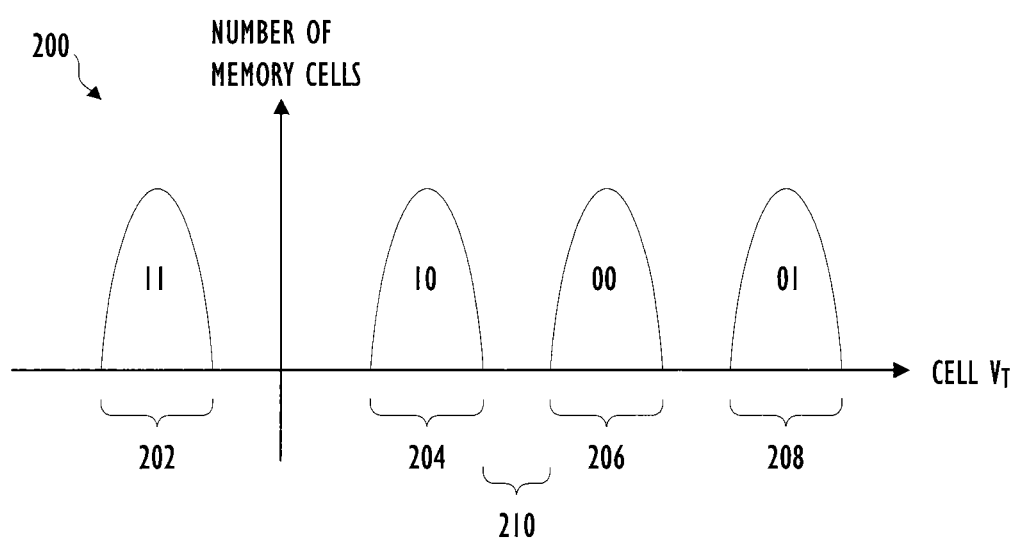
FIG. 2 shows an shows a graphical representation of threshold voltage ranges in a population of memory cells.
Figure 3:
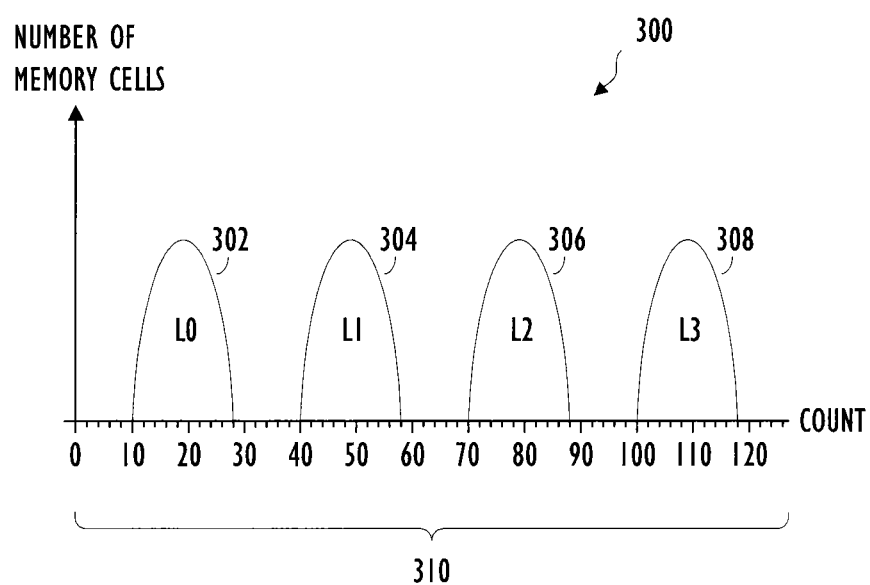
FIG. 3 shows a distribution of counts for a read operation.
Figure 4:
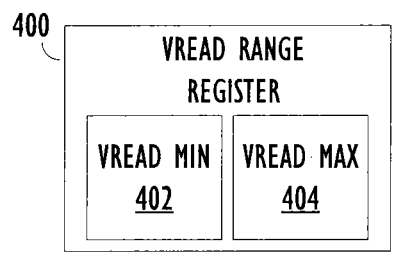
FIG. 4 shows a block diagram of a VREAD Range Register of a memory device.

A typical sense operation in a NAND flash memory device can be described by way of reference to FIG. 3. FIG. 3 illustrates a group of count distributions 302-308, such as corresponding to the threshold voltage ranges shown in FIG. 2, for example. The sense operation is performed by applying a ramping voltage ("VREAD") to a word line selected for sensing, such as WL4 $118_4$ shown in FIG. 1, for example. The ramped VREAD voltage has a minimum and maximum value and might have a range of −3V to 5V, for example. The x-axis of FIG. 3 is shown as counts from 0 to 127 wherein the minimum VREAD voltage corresponds to a count of 0 and the maximum VREAD voltage corresponds to a count of 127. FIG. 4 illustrates a block diagram of a VREAD range register 400 of a memory device which comprises a 7-bit register to set the minimum VREAD voltage value 402 and a 7-bit register to set the maximum VREAD voltage value 404, for example. As the ramped VREAD voltage is applied to the selected word line, a counter in the memory device increments the count until the programmed threshold voltage of the selected memory cell is reached or exceeded. The present value of the counter is therefore indicative of the threshold voltage of the selected memory cell. The read resolution of the memory device is tied to range of the applied ramped VREAD voltage. The VREAD voltage range divided by the count range is equal to the read resolution. For example, a sense voltage range of 8V (e.g., −3V to 5V) divided by a count range of 128 counts (e.g., 0 to 127), as shown in FIG. 3, would yield a read resolution of 62.5 mV per count.

Figure 5:
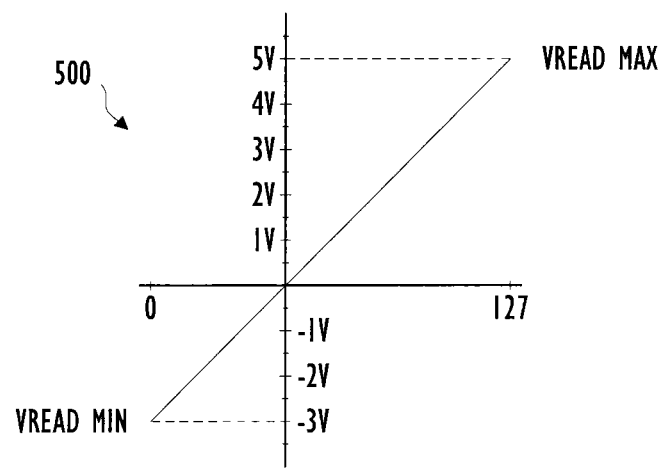
FIG. 5 shows a sense voltage waveform utilized as part of a typical sense operation.

FIG. 5 illustrates a voltage waveform 500 of the ramped VREAD voltage utilized during a sense operation such as shown in FIG. 3, for example. As an example, a 7-bit value corresponding to the minimum VREAD (e.g., VREAD MIN) value of −3V shown in FIG. 5 might be loaded into the VREAD min register 402 of the VREAD range register 400 of FIG. 4. A 7-bit value corresponding to the maximum VREAD (e.g., VREAD MAX) value of 5V shown in FIG. 5 might be loaded into the VREAD max register 404 of the VREAD range register 400.

As described above, program disturb can be an issue when performing programming operations in a memory device. A method typically utilized to address the program disturb issue is to perform two programming operations. The first programming operation is an intermediate programming operation and is sometimes referred to as a "ghost" programming operation. The second programming operation is sometimes referred to as a "final" programming operation. This method can be further described by way of reference to Table 1 and FIG. 6.

Figure 6:
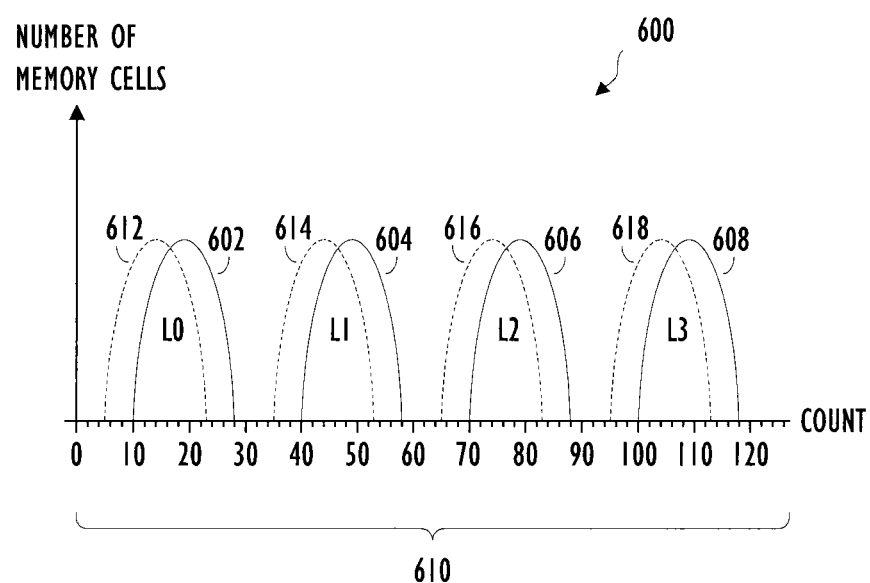
FIG. 6 shows a distribution of counts for a typical programming operation.

The ghost program count distributions 612-618 are indicated by the dashed lines shown in FIG. 6. The final program count distributions 602-608 are indicated by the solid lines in FIG. 6. The final program count distributions 602-608 are similar to those shown in FIG. 2, for example. The ghost program operations are intended to program a selected memory cell to an intermediate programmed state. The intermediate state is selected to compensate for the program disturb effects caused when a nearby (e.g., adjacent) memory cell is programmed during a subsequent programming operation.

An issue with the typical ghost/final programming operation discussed above is that it can be very time consuming. For example, a memory cell might have a target programmed data state of L1 corresponding to distribution 604, for example. In this example, the memory cell would be programmed to the ghost state L1 corresponding to distribution 614 prior to being programmed to its final L1 state corresponding to distribution 604. To accomplish this, a location corresponding to the selected memory in what is known as data buffer memory (DBM) of the memory device is loaded with the binary number of the minimum count value for the ghost L1 state such as shown in Table 1. For example, the DBM might be comprised of a plurality of data latches which are associated with memory cells of the memory array. The minimum count for the ghost state of L1 for the selected memory cell would be a count value of 35 (0100011) in the example of FIG. 6. These ghost count values shown in Table 1 need to be loaded in the DBM for each memory cell to be programmed during a programming operation of a selected block of memory cells, for example. Loading these count values into the DBM is referred to as a "pattern load." As a pattern load must be made for each selected memory cell, this might result in hundreds of pattern loads of binary count values prior to performing the ghost programming operation on a block of selected memory cells. Following the pattern loads of the ghost count values in the DBM, one or more programming pulses are then applied to a selected row until all the selected memory cells of the selected row achieve their target ghost programmed states. Following each program pulse, a sense operation such as discussed above with respect to FIG. 3 is performed to determine if the selected memory cells have completed the ghost programming operation.

Upon completion of the ghost programming operation on a first selected row of memory cells, a similar ghost programming operation is performed on a second row of memory cells to be programmed, such as an adjacent row of memory cells, for example. Thus, one or more programming pulses are applied to the second selected row until each memory cell of the second row selected for programming achieves their target ghost programmed state.

Once the second selected row has completed its ghost programming operation, the selected memory cells of the first selected row still need to be programmed to their target final programmed state. Similar to the ghost pattern load, a final count value pattern load is loaded into the DBM for each selected memory cell. For example, the DBM for a selected memory cell to be programmed to a data state of L2 corresponding to distribution 606 would first be loaded with a ghost count value of 65 (1000001b) during the ghost programming operation in the example of FIG. 6. After completing the ghost programming operation, the final count value of 70 (1000110b) must then be loaded into the DBM prior to performing the final programming operation. A series of programming pulses are applied to the selected row until each selected memory cell of the row have achieved their target final programmed states. A verify operation is performed following each applied programming pulse to determine if the selected memory cells have achieved their target programmed state. Thus, the process discussed above of pattern loading of the DBM must be done twice, once with the ghost count values then again with the final program count values. As possibly hundreds or even thousands of memory cells might be selected for programming, having to load the DBM twice to accomplish the ghost/final programming of an entire block of memory cells is time consuming and requires a large amount of input/output (I/O) operations to be performed.

TABLE 1

| Programmed State | Ghost Pattern Load | | Final Pattern Load | | Ghost and Final VREAD | |
|---|---|---|---|---|---|---|
| | Decimal | Binary | Decimal | Binary | Min | Max |
| L0 | 5 | 0000101 | 10 | 0001010 | −3.5 V | 5 V |
| L1 | 35 | 0100011 | 40 | 0101000 | | |
| L2 | 65 | 1000001 | 70 | 1000110 | | |
| L3 | 95 | 1011111 | 100 | 1100100 | | |

It should be noted that both the ghost and the final programming operation discussed with respect to FIG. 6 use the same VREAD voltage range of −3V to 5V, corresponding to counts of 0 to 127 such as discussed above with respect to FIG. 3. The static VREAD range utilized in the ghost and the final programming operations should therefore be wide enough to encompass both the placement of the ghost distributions 612-618 and the final distributions 602-608. Thus, the sense (e.g., verify) resolution in the ghost programming operation is the same as in the final programming operation. As discussed above with respect to FIG. 4, the minimum value and a maximum value for the VREAD range used during the ghost and the final programming operation is set by loading a register in the memory device.

Figure 7:
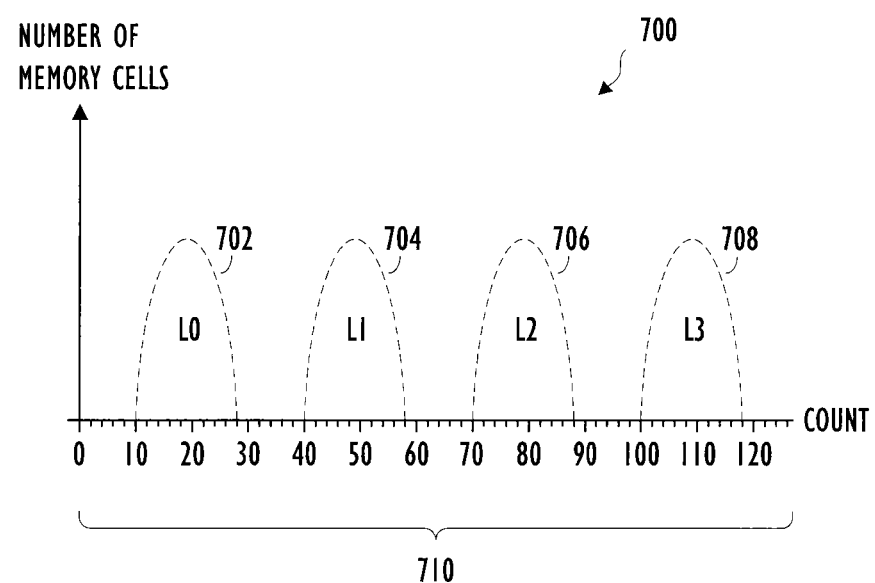
FIG. 7 shows a distribution of counts according to an embodiment of the present disclosure.
Figure 9:
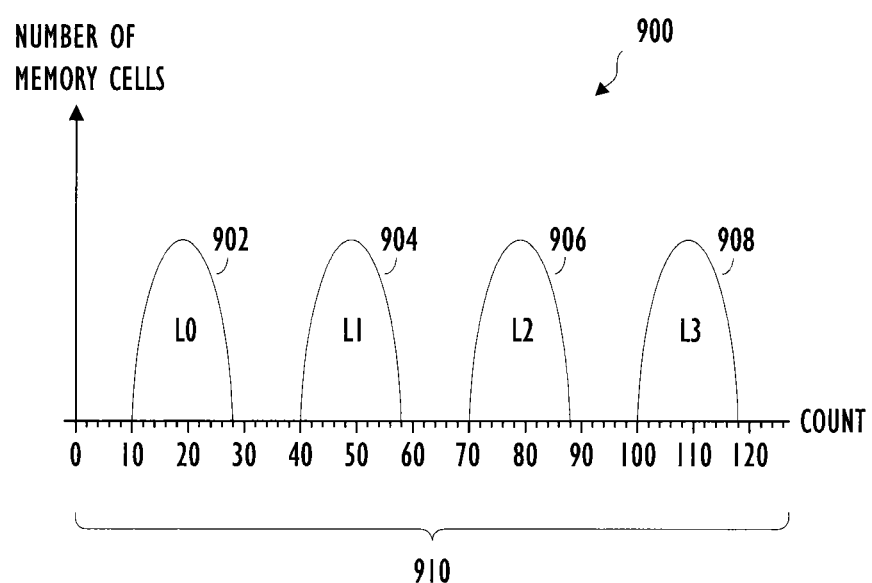
FIG. 9 shows a distribution of counts according to an embodiment of the present disclosure.

Programming methods according to various embodiments of the present disclosure can offer significant improvements over the programming methods such as discussed above with respect to FIG. 6. A ghost/final programming operation according to one or more embodiments of the present disclosure can be discussed by way of reference to Table 2 and FIGS. 7, 9 and 11. FIG. 7 illustrates count distributions for a ghost programming operation while FIG. 9 illustrates count distributions for the final programming operation according to various embodiments of the present disclosure. It should be noted that the count values corresponding to ghost distributions and the final distributions shown in Table 2 and in FIGS. 7 and 9 are the same. Thus, the count range of the L1 state (e.g., 40 to 58) for the L1 ghost distribution 704 of FIG. 7 is the same count range for the L1 state for the final L1 distribution 904 of FIG. 9, for example. However, the represented threshold voltage ranges will differ due to the use of different VREAD ranges for each programming operation.

The benefits of a ghost/final programming operation according to various embodiments of the present disclosure can be realized with a single pattern load of data of the DBM for the ghost and the final programming operation to be performed on a block of memory. For example, the target data (e.g., minimum count values) for various programmed states are loaded only once in the DBM data latches associated with the selected memory cells. According to one or more embodiments, this target data is data representative of the target minimum count value corresponding to a minimum programmed threshold voltage, for example. This is in contrast with having to perform a first pattern load of the DBM for the ghost programming operation and performing a second pattern load of the DBM for the final programming operation such as discussed above with respect to FIG. 6, for example. By eliminating the second pattern load of the DBM, methods according to various embodiments of the present disclosure can facilitate a significant reduction in programming time and the number of I/O operations to be performed.

During a ghost programming operation according to various embodiments of the present disclosure, count values for the selected memory cells are loaded into the DBM of the memory device. The count value loaded into the DBM for each memory cell to be programmed corresponds to the count value associated with the target programmed state of each selected memory cell, such as the count values shown in Table 2 and FIGS. 7 and 9. For example, a memory cell to be ghost programmed to state L0 will have a pattern load count value of 10 (0001010b) corresponding to the minimum count value for state L0 corresponding to distribution 702 shown in FIG. 7. A memory cell to be ghost programmed to state L1 will have a pattern load count value of 40 (0101000b) corresponding to the minimum count value for state L1 corresponding to distribution 704 shown in FIG. 7. A memory cell to be ghost programmed to state L2 corresponding to distribution 706 will have a pattern load count value of 70 (1000110b) corresponding to minimum count value for state L2 shown in FIG. 7. And, a memory cell to be ghost programmed to state L3 corresponding to distribution 708 will have a pattern load count value of 100 (1100100b) corresponding to minimum count value for state L3 shown in FIG. 7. It should be noted however that methods according to various embodiments of the present disclosure are not limited to the programmed states L0-L3 and associated counts shown in Table 2 and in FIGS. 7 and 9.

Figure 8:
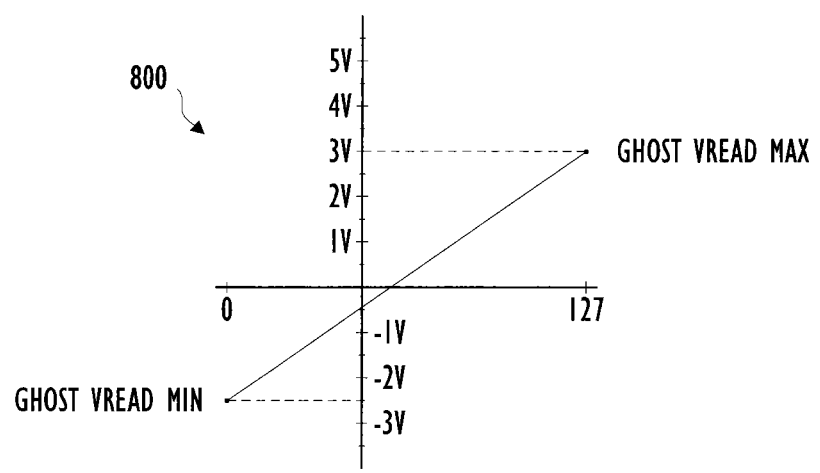
FIG. 8 shows a sense voltage waveform according to an embodiment of the present disclosure.

FIG. 8 illustrates a plot of the ramped ghost operation VREAD voltage 800 applied during a verify operation performed during a ghost programming operation according to various embodiments of the present disclosure. Prior to performing the ghost programming operation the ghost VREAD minimum value and maximum value are loaded into the VREAD Range Register of the memory device, such as discussed above with respect to FIG. 4. These VREAD minimum and maximum values are sometimes referred to as "trim values." It is shown in Table 2 and in FIG. 8 that the ghost program minimum VREAD value is −2.5V (corresponding to a count of 0), and the ghost program maximum VREAD value is 3V (corresponding to a count of 127) for this example. However, other ghost program minimum/maximum VREAD values are possible according to various embodiments of the present disclosure.

TABLE 2

| Programmed State | Ghost and Final Pattern Load | | Ghost VREAD | | Final VREAD | |
| --- | --- | --- | --- | --- | --- | --- |
| | Decimal | Binary | Min | Max | Min | Max |
| L0 | 10 | 0001010 | −2.5 V | 3 V | −2 V | 3.5 V |
| L1 | 40 | 0101000 | | | | |
| L2 | 70 | 1000110 | | | | |
| L3 | 100 | 1100100 | | | | |

Upon completion of the ghost programming operation, a final programming operation is performed according to one or more embodiments of the present disclosure. FIG. 9 illustrates count distributions 902-908 corresponding to the final programming operation of selected memory cells. It should be noted that the counts 910 associated with the programmed states shown in FIG. 9 are the same as the counts 710 shown in FIG. 7 as discussed above, although the represented threshold voltage ranges differ. Thus, as the ghost and the final programming operations use the same pattern load data, the DBM does not need to be loaded between the ghost and the final operation as is needed in the method discussed above with respect to FIG. 6, for example. The pattern load data utilized for the final programming operation is the same as the pattern load data loaded prior to the start of the ghost programming operation according to various embodiments of the present disclosure. Because various embodiments utilize a different VREAD range during the verify operation of the ghost programming operation than during the verify operation of the final programming operation, the same pattern load data will correspond to different word line voltages for each verify operation. For the example of Table 2, a pattern load data of 70 decimal (1000110b) (e.g., L2 programmed state) might correspond to a word line voltage of 0.5V during a verify operation of a ghost programming operation, while that same pattern load data might correspond to a word line voltage of 1.0V during a verify operation of a final programming operation as shown in FIG. 11.

Figure 10:
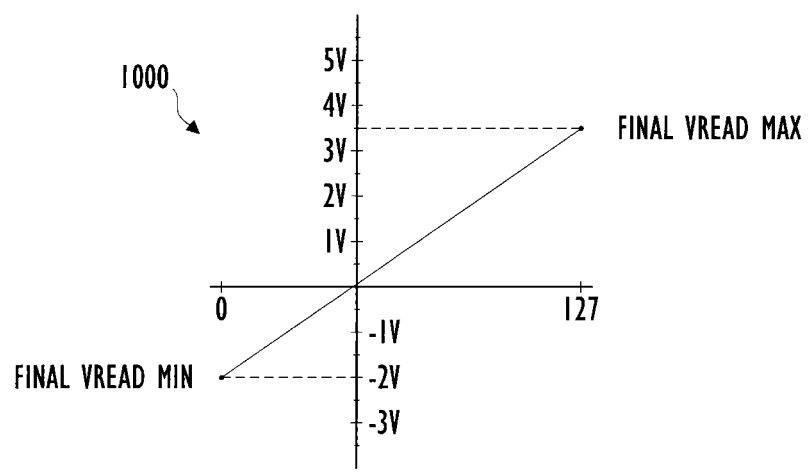
FIG. 10 shows a sense voltage waveform according to an embodiment of the present disclosure.

FIG. 10 illustrates a plot of the ramped VREAD voltage 1000 applied during a sense operation performed during a final programming operation according to various embodiments of the present disclosure. Subsequent to completing the ghost programming operation and prior to performing the final programming operation, the final program VREAD minimum value and maximum value are loaded into the VREAD Range Register of the memory device, such as discussed above with respect to FIG. 4. It is shown in Table 2 and in FIG. 10 that the final program minimum VREAD value is −2V (corresponding to a count of 0), and the final program maximum VREAD value is 3.5V (corresponding to a count of 127). However, other final program minimum/maximum VREAD values are possible according to various embodiments of the present disclosure.

Figure 11:
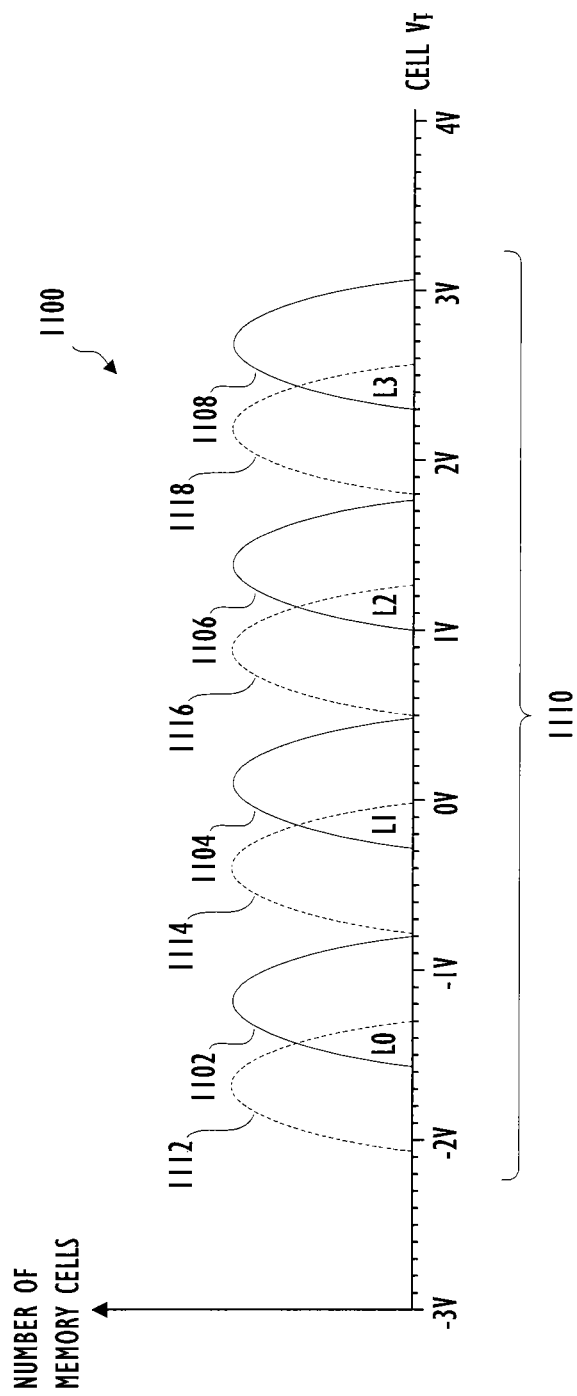
FIG. 11 shows a combined distribution of threshold voltage ranges corresponding to the count distributions shown in FIGS. 7 and 9 according to an embodiment of the present disclosure.

FIG. 11 illustrates a combined plot 1100 of the ghost distributions 1112-1118 and final distributions 1102-1108 according to various embodiments of the present disclosure. For example, the plot 1100 shown in FIG. 11 represents the resulting ghost and final programmed states L0-L3 as represented by distributions 702-708 and 902-908, respectively, shown in FIGS. 7 and 9. The ghost threshold voltage distributions 1112-1118 correspond to the ghost count distributions 702-708 shown in FIG. 7. The final threshold voltage distributions 1102-1108 correspond to final count distributions 902-908 shown in FIG. 9. It should be noted that the x-axis shown in FIG. 11 is shown as memory cell threshold voltage (Cell $V_T$) 1110 and not counts 710, 910 as are shown in FIGS. 7 and 9. Thus, FIGS. 7, 9 and 11 illustrate that the programmed states L0-L3 of FIG. 11 can be obtained by utilizing the same pattern loads for the ghost and the final programming operation and adjusting the VREAD ranges (e.g., trim values) between the ghost and the final programming operation.

It should also be noted that the VREAD voltage ranges utilized by the ghost and the final programming operations according to various embodiments of the present disclosure allow for an increased sense resolution of each range of threshold voltages. In the typical programming method discussed above, the VREAD range utilized needed to be wide enough to encompass the placement of both the ghost and the final programmed states. However, according to various embodiments of the present disclosure, the VREAD ranges utilized during a ghost programming operation need only be wide enough to encompass the placement of the ghost programmed states. Similarly, the VREAD ranges utilized during the final programming operation need only be wide enough to encompass the placement of the final programmed states. For example, as shown in Table 2, the delta between the minimum and the maximum VREAD voltages for both the ghost and the final programming operations is 5.5V (e.g., 3.5V−(−2V)). Thus, the read resolution would be (5.5V/128 counts) yielding a read resolution of 43.0 mV per count. This improves the read resolution and facilitates a more accurate placement of programmed states in a selected memory cell than provided by the typical programming operation discussed above with respect to FIG. 6. However, it should be noted that various embodiments of the present disclosure are not limited to utilizing the same sense resolution (e.g., increased read resolution) for the ghost and the final programming operations. A particular sense resolution might be utilized for a ghost programming operation wherein a different sense resolution might be utilized during a subsequent final programming operation according to one or more embodiments of the present disclosure, for example.

Figure 12:
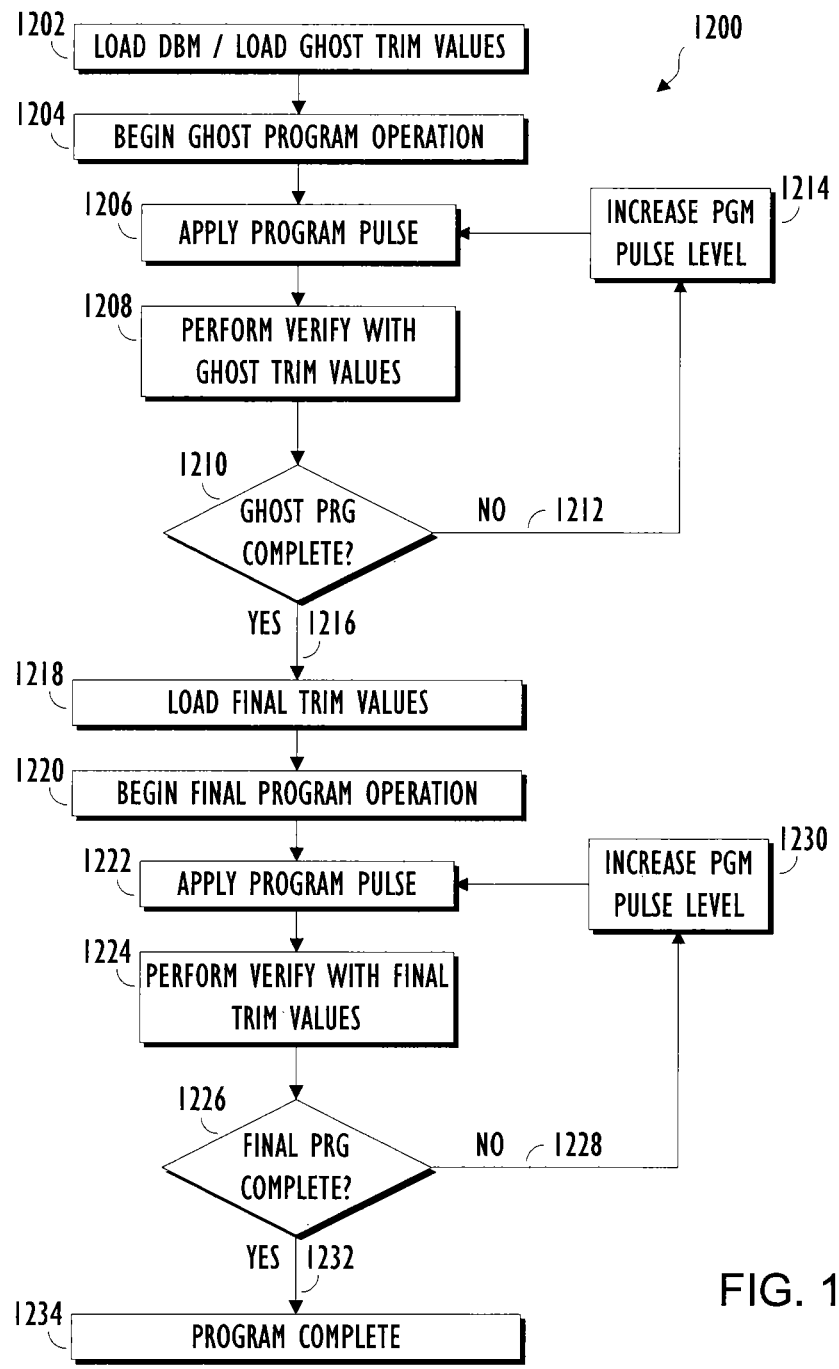
FIG. 12 shows flowchart of a programming operation according to an embodiment of the present disclosure.

FIG. 12 illustrates a flowchart of a ghost/final programming operation 1200 according to one or more embodiments of the present disclosure. The ghost/final programming operation 1200 begins by loading the DBM with the pattern load data 1202 to be programmed into the selected memory cells, such as into a block of memory cells comprising memory cells selected for programming, for example. In addition, the ghost trim values are loaded into the VREAD Range Register 1202 to set the start (e.g., minimum) and final (e.g., maximum) VREAD voltages which define the ramped VREAD voltage to be applied during verification of memory cell programming during the ghost programming operation of the selected memory cells according to various embodiments of the present disclosure.

During the ghost programming operation, one or more programming pulses are applied 1206 to word lines comprising memory cells selected for programming. Following the application of one or more programming pulses, a verify operation 1208 is performed on the selected memory cells of a selected row to determine if any or all of the selected memory cells have achieved their target ghost programmed states. For example, a ramped VREAD voltage having minimum and maximum values such as shown in FIG. 8 might be applied to determine the programmed state of selected memory cells. Should selected memory cells require additional programming 1212, the program pulse level is increased 1214 and one or more additional programming pulses are again applied to the selected row of memory cells 1206. This programming operation is repeated until all selected memory cells of the selected row achieve their target programmed state (e.g., pass the ghost verify operation 1216.) Although not shown in FIG. 12, if one or more memory cells fail to complete the ghost programming operation after a particular number of programming pulses have been applied, an indication might be made that these memory cells are defective and might be blocked from future use, for example.

Upon completion of the ghost programming operation 1216, the final trim values are loaded into the VREAD Range Register 1218 to set the start (e.g., minimum) and final (e.g., maximum) VREAD voltages which define the ramped VREAD voltage to be applied during verification of memory cell programming during the final programming operation of the selected memory cells according to various embodiments of the present disclosure. It should be noted that the trim values are changed (e.g., minimum and/or maximum VREAD range register data values) following completion of the ghost programming operation and prior to the final programming operation. However, the pattern load data that was loaded 1202 prior to the ghost programming operation are not changed following the completion of the ghost programming operation and prior to beginning the final programming operation 1220. This is in contrast to the typical programming operation wherein new pattern load data would be loaded into the DBM following the completion of the ghost programming operation and prior to performing the final programming operation such as discussed above with respect to FIG. 6, for example.

The final programming operation comprises applying one or more programming pulses to a selected row of memory cells. Following the application of the programming pulses, a verify operation is performed to determine if the selected memory cells of the selected row have reached their target final programmed states. Following the application of the one or more programming pulses, a verify operation 1224 is performed on the selected memory cells of a selected row to determine if any or all of the selected memory cells have achieved their target final programmed states. For example, a ramped VREAD voltage such as shown in FIG. 10 might be applied to determine the programmed state of selected memory cells. The verify operations 1224 performed as part of the final programming operation utilizes the final trim values loaded after the completion of the ghost programming operation. Should selected memory cells require additional programming 1228, the program pulse level is increased 1230 and one or more additional programming pulses are again applied to the selected row of memory cells 1222.

The final programming operation is repeated until all selected memory cells of the selected row achieve their target programmed state (e.g., pass the final program verify operation 1232.) Although not shown in FIG. 12, if one or more memory cells fail to complete the ghost programming operation after a particular number of programming pulses have been applied, an indication might be made that these memory cells are defective and might be blocked from future use, for example.

Figure 13:
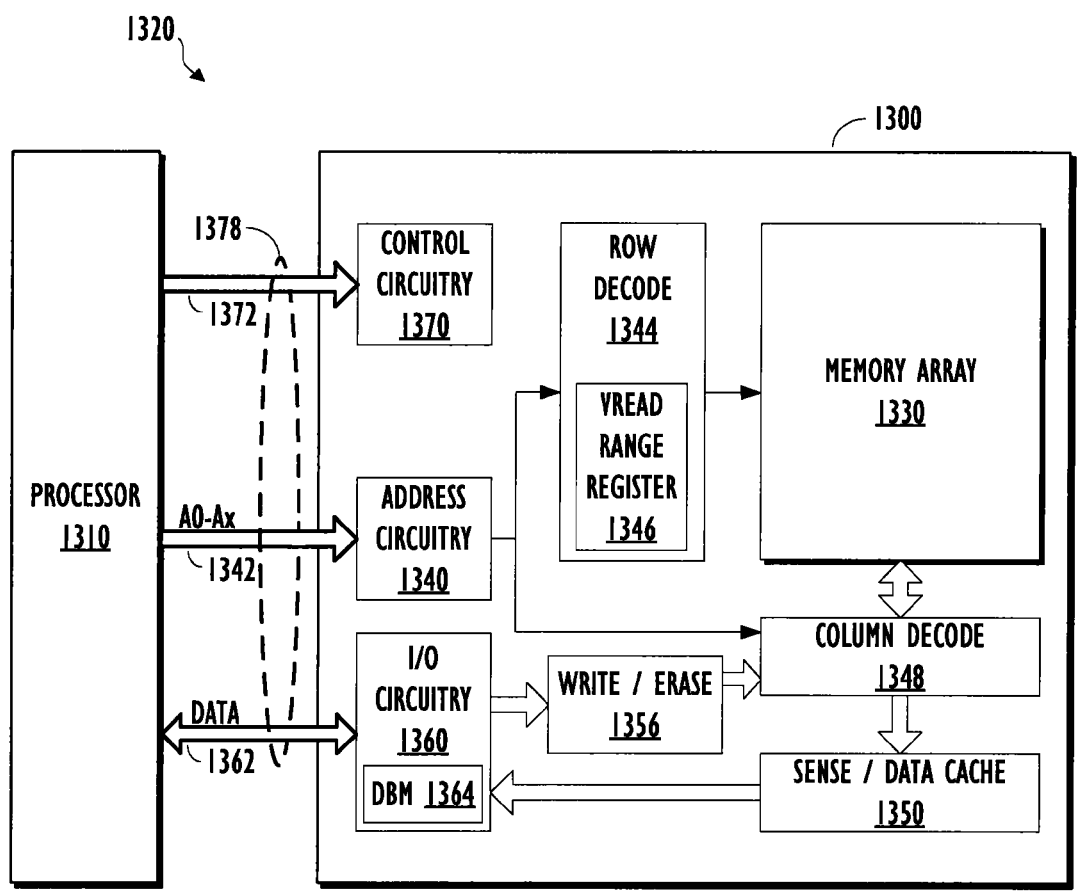
FIG. 13 illustrates a functional block diagram of a system according to an embodiment of the present disclosure.

FIG. 13 is a functional block diagram of an electronic system having at least one memory device according to one or more embodiments of the present disclosure. The memory device 1300 illustrated in FIG. 13 is coupled to a host such as a processor 1310. The processor 1310 may be a microprocessor or some other type of controlling circuitry. The memory device 1300 and the processor 1310 form part of an electronic system 1320. The memory device 1300 has been simplified to focus on features of the memory device that are helpful in understanding various embodiments of the present disclosure.

The memory device 1300 includes one or more arrays of memory cells 1330 that can be logically arranged in banks of rows and columns. According to one or more embodiments, the memory cells of memory array 1330 are flash memory cells. The memory array 1330 might include multiple banks and blocks of memory cells residing on a single or multiple die as part of the memory device 1300. Memory array 1330 may comprise SLC and/or MLC memory, for example. The memory cells of the memory array 1330 may also be adaptable to store varying densities (e.g., MLC (four level) and MLC (eight level)) of data in each cell, for example.

An address buffer circuit 1340 is provided to latch address signals provided on address input connections A0-Ax 1342. Address signals are received and decoded by a row decoder 1344 and a column decoder 1348 to access the memory array 1330. The row decoder circuitry 1344 might also incorporate the circuitry to generate the ramped word line VREAD voltages and comprise the VREAD range register 1346 discussed above according to various embodiments of the present disclosure, for example. It will be appreciated by those skilled in the art, with the benefit of the present description, that the number of address input connections 1342 depends on the density and architecture of the memory array 1330. That is, the number of address digits increases with both increased memory cell counts and increased bank and block counts, for example.

The memory device 1300 reads data in the memory array 1330 by sensing voltage or current changes in the memory array columns using sense devices, such as sense/data cache circuitry 1350. The sense/data cache circuitry 1350, in at least one embodiment, is coupled to read and latch a row of data from the memory array 1330. Data input and output (I/O) buffer circuitry 1360 is included for bi-directional data communication over a plurality of data connections 1362 with the processor 1310. The DBM 1364 discussed above might also comprise a portion of the I/O circuitry 1360. Write/erase circuitry 1356 is provided to write data to or to erase data from the memory array 1330.

Control circuitry 1370 is configured at least in part to implement various embodiments of the present disclosure, such as facilitating the methods discussed above with respect to FIG. 12, for example. Control circuitry 1370 might also comprise the counter circuitry utilized during a sense (e.g., verify) operation discussed above, for example. In at least one embodiment, the control circuitry 1370 may utilize a state machine. Control signals and commands can be sent by the processor 1310 to the memory device 1300 over the command bus 1372. The command bus 1372 may be a discrete signal or may be comprised of multiple signals, for example. These command signals 1372 are used to control the operations on the memory array 1330, including data read, data program (e.g., write), and erase operations. The command bus 1372, address bus 1342 and data bus 1362 may all be combined or may be combined in part to form a number of standard interfaces 1378. For example, the interface 1378 between the memory device 1300 and the processor 1310 may be a Universal Serial Bus (USB) interface. The interface 1378 may also be a standard interface used with many hard disk drives (e.g., SATA, PATA) as are known to those skilled in the art.

The electronic system illustrated in FIG. 13 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide methods of programming memory cells by adjusting trim values utilized during verify operations performed during a programming operation. These methods can facilitate a reduction in the amount of data adjustment and I/O loads performed during a programming operation. These methods can facilitate a significant reduction in the overall time required to program and verify data in a memory device and improve the placement resolution of data states in a memory device.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method for programming a memory cell of a memory device, the method comprising:
    storing target data into latches associated with the memory cell wherein the target data is data representative of a target count value corresponding to a minimum programmed threshold voltage;
    performing a first iteration of a programming operation, wherein the programming operation comprises:
        setting a minimum and a maximum voltage value in a register associated with a circuit configured to generate a ramped voltage from the minimum to the maximum voltage values set in the register;
        biasing a control gate of the memory cell with a programming pulse; and
        performing a program verify operation on the memory cell where the program verify operation comprises:
            incrementing a counter having a minimum and a maximum counter value while applying the ramped voltage to the control gate wherein the minimum counter value corresponds to the minimum voltage of the applied ramped voltage and the maximum counter value corresponds to the maximum voltage of the applied ramped voltage; and
            latching the counter value responsive to activating the memory cell and comparing the latched counter value to the target count value; and
    performing a second iteration of the programming operation subsequent to performing the first iteration of the programming operation wherein at least one of the minimum or maximum voltage values set in the register during the second iteration is different than a respective one of the minimum and/or maximum voltage values set in the register during the first iteration.

2. The method of claim 1, further comprising repeating the programming operation of the first iteration of the programming operation until the latched counter value equals or exceeds the target count value.

3. The method of claim 1, further comprising repeating the programming operation of the second iteration of the programming operation until the latched counter value equals or exceeds the target count value.

4. The method of claim 1, wherein storing target data into latches associated with the memory cell further comprises storing target data into latches associated with the memory cell a single time for use during the first and the second iterations of the programming operation.

5. The method of claim 1, wherein the minimum voltage value set in the register of the second iteration is greater than the minimum voltage set in the register of the first iteration.

6. The method of claim 1, wherein the maximum voltage value set in the register during the second iteration is greater than the maximum voltage value set in the register during the first iteration.

7. The method of claim 1, wherein a difference between the minimum and the maximum voltage values set during the first iteration and a difference between the minimum and the maximum voltage values set during the second iteration are equal.

8. The method of claim 1, further comprising receiving target data representative of a target programmed state of the memory cell.

9. The method of claim 1, wherein the minimum voltage of the first ramped voltage is selected to at least partially compensate for coupling effects caused when programming pulses are applied to one or more adjacent memory cells of the memory device subsequent to applying a first programming pulse and prior to applying a second programming pulse.

10. The method of claim 1, wherein storing target data into the latches further comprises storing target data into the latches prior to performing the first iteration of the programming operation, wherein the target data is representative of a target programmed state of the memory cell.

11. The method of claim 1, wherein setting the minimum and maximum voltage values in the register further comprises setting the minimum and maximum voltage values in the register by loading the register with a first data value representative of the minimum voltage of a first ramped voltage and a second data value representative of the maximum voltage of the first ramped voltage prior to performing the first iteration of the programming operation.

12. The method of claim 11, wherein setting the minimum and maximum voltage values in the register further comprises setting the minimum and maximum voltage values in the register by loading the register with a third data value representative of the minimum voltage of a second ramped voltage and a fourth data value representative of the maximum voltage of the second ramped voltage prior to performing the second iteration of the programming operation.

13. A method for programming a memory cell of a memory device, the method comprising:
    storing target data into latches associated with the memory cell wherein the target data is data representative of a target count value corresponding to a minimum programmed threshold voltage;
    performing a first iteration of a programming operation, wherein the programming operation comprises:
        setting a minimum and a maximum voltage value in a register associated with a circuit configured to generate a ramped voltage from the minimum to the maximum voltage values set in the register;
        biasing a control gate of the memory cell with a programming pulse; and
        performing a program verify operation on the memory cell where the program verify operation comprises:
            incrementing a counter having a minimum and a maximum counter value while applying the ramped voltage to the control gate wherein the minimum counter value corresponds to the minimum voltage of the applied ramped voltage and the maximum counter value corresponds to the maximum voltage of the applied ramped voltage; and
            latching the counter value responsive to activating the memory cell and comparing the latched counter value to the target count value; and
    performing a second iteration of the programming operation subsequent to performing the first iteration of the programming operation wherein the minimum and maximum voltage values set in the register during the second iteration are different than respective minimum and maximum voltage values set in the register during the first iteration.

14. The method of claim 13, wherein a difference between the minimum and maximum voltages set during the first iteration of the programming operation is the same as a difference between the minimum and maximum voltages set during the second iteration of the programming operation.

15. The method of claim 13, wherein a difference between the minimum and maximum voltages set during the first iteration of the programming operation and a difference between the minimum and maximum voltages set during the second iteration of the programming operation are different.

16. The method of claim 13, further comprising repeating at least one of the programming operations of the first iteration of the programming operation or the programming operation of the second iteration of the programming operation until the latched counter value is equal to or exceeds the target count value.

17. The method of claim 16, wherein setting a minimum and a maximum voltage value in a register further comprises setting the minimum and the maximum voltage value in the register a single time while the first iteration of the programming operation is repeated or while the second iteration of the programming operation is repeated.

18. The method of claim 13, further comprising maintaining the target data in the latches while performing the first and the second iterations of programming operations.

19. A method for programming a memory cell of a memory device, the method comprising:
    storing target data into latches associated with the memory cell wherein the target data is data representative of a target count value corresponding to a minimum programmed threshold voltage;
    performing one or more first iterations of a programming operation, wherein the programming operation comprises:
        setting a minimum and a maximum voltage value in a register associated with a circuit configured to generate a ramped voltage from the minimum to the maximum voltage values set in the register;
        biasing a control gate of the memory cell with a programming pulse; and
        performing a program verify operation on the memory cell where the program verify operation comprises:
            incrementing a counter having a minimum and a maximum counter value while applying the ramped voltage to the control gate wherein the minimum counter value corresponds to the minimum voltage of the applied ramped voltage and the maximum counter value corresponds to the maximum voltage of the applied ramped voltage; and
            latching the counter value responsive to activating the memory cell and comparing the latched counter value to the target count value;
    repeating the one or more first iterations of the programming operation until the latched counter value equals or exceeds the target count value; and
    performing one or more second iterations of the programming operation subsequent to performing the one or more first iterations of the programming operation wherein at least one of the minimum or maximum voltage values set in the register during the one or more second iterations is different than a respective one of the minimum and/or maximum voltage values set in the register during the one or more first iterations.

20. The method of claim 19, further comprising maintaining the target data in the latches while performing the one or more first iterations of the programming operation and while performing the one or more second iterations of the programming operation.

* * * * *